US006998306B2

(12) United States Patent
Kim et al.

(10) Patent No.: US 6,998,306 B2
(45) Date of Patent: Feb. 14, 2006

(54) SEMICONDUCTOR MEMORY DEVICE HAVING A MULTIPLE TUNNEL JUNCTION PATTERN AND METHOD OF FABRICATING THE SAME

(75) Inventors: Woo-Sik Kim, Kyunggi-do (KR); Ji-Hye Yi, Yongin-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 168 days.

(21) Appl. No.: 10/747,449

(22) Filed: Dec. 30, 2003

(65) Prior Publication Data

US 2004/0150022 A1    Aug. 5, 2004

Related U.S. Application Data

(62) Division of application No. 10/260,387, filed on Oct. 1, 2002, now Pat. No. 6,707,089.

(30) Foreign Application Priority Data

Oct. 5, 2001  (KR)  ............................... 2001-61370

(51) Int. Cl.
*H01L 21/8234* (2006.01)
(52) U.S. Cl. .................... 438/238; 257/20; 257/23; 257/24; 257/28; 257/331; 257/903; 257/904

(58) Field of Classification Search ................. 257/20, 257/23, 24, 28, 331, 903, 904
See application file for complete search history.

(56) References Cited

U.S. PATENT DOCUMENTS

| 5,952,692 A | 9/1999 | Nakazato et al. |
| 6,072,718 A | 6/2000 | Abraham et al. |
| 6,528,896 B1 * | 3/2003 | Song et al. ................. 257/327 |

* cited by examiner

*Primary Examiner*—Mai-Huong Tran
(74) *Attorney, Agent, or Firm*—Lee & Morse, P.C.

(57) ABSTRACT

The present invention discloses a semiconductor memory device having a multiple tunnel junction pattern and a method of forming the same. The semiconductor memory device includes a unit cell composed of planar transistor and vertical transistors. The planar transistor includes first and second conductive regions formed at predetermined regions of a semiconductor substrate and a storage node stacked on a channel region therebetween. The vertical transistor includes a storage node, a multiple tunnel junction pattern stacked thereon, a data line stacked thereon, and a word line for covering both sidewalls of the storage node and the multiple tunnel junction pattern. Width of the multiple tunnel junction pattern is narrower than the storage node and data lines. Semiconductor layers and tunnel oxide layers are alternately and repeatedly stacked and anisotropically etched to form the multiple tunnel junction pattern of narrow width while forming the data line and the storage node.

10 Claims, 18 Drawing Sheets

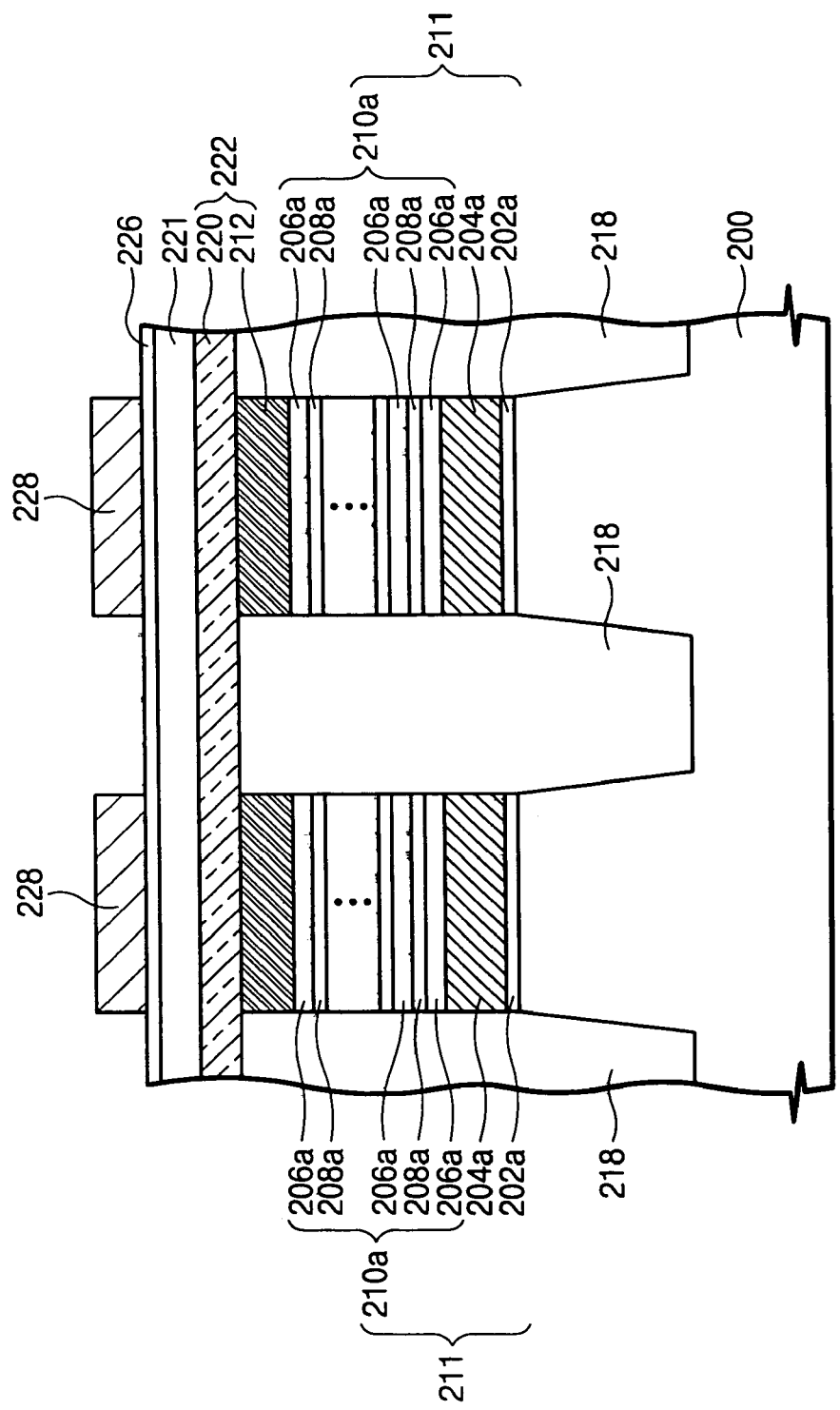

SEMICONDUCTOR MEMORY DEVICE HAVING A MULTIPLE TUNNEL JUNCTION PATTERN AND METHOD OF FABRICATING THE SAME

This application is a DIVISION of application Ser. No. 10/260,387, filed Oct. 1, 2002 now U.S. Pat. No. 6,707,089.

BACKGROUND OF THE INVENTION

1. Field of the Invention

The present invention relates to a semiconductor memory device and a method of fabricating the same. More particularly, the present invention relates to a semiconductor memory device having a multiple tunnel junction pattern and a method of fabricating the same.

2. Description of the Related Art

Advantages of dynamic random access memory (DRAM) include higher integration in a limited area than a memory device, such as static random access memory (SRAM), and faster operation speed than a memory device, such as a flash memory. A disadvantage of DRAM, however, is that it must be refreshed periodically in order to retain stored data. Thus, the DRAM consumes power even in a stand-by mode.

On the contrary, a non-volatile memory device such as a flash memory device has the advantage that periodic refreshes are unnecessary. The non-volatile memory device, however, has several disadvantages such as a high voltage demand for programming or erasing memory cells and slow operation speed in comparison with a DRAM or an SRAM. Thus, a new memory device uniting DRAM with flash memory has been developed.

FIG. 1 illustrates a diagram showing a unit cell of a semiconductor memory device having a conventional multiple tunnel junction pattern.

Referring to FIG. 1, a unit cell of a semiconductor memory device includes a planar transistor and a vertical transistor. The planar transistor is formed at a predetermined region of a semiconductor substrate 100, and includes a drain region 124d, a source region 124s and a floating gate 104. The drain region 124d and the source region 124s are spaced apart from each other. The floating gate 104 is arranged on a channel region between the drain region 124d and the source region 124s. The drain region 124d corresponds to a bit line and the floating gate 104 corresponds to a storage node. A gate insulating layer 102 is interposed between the storage node 104 and the channel region.

A multiple tunnel junction pattern 110 and a data line 122 are sequentially stacked on the storage node 104. The multiple tunnel junction pattern 110 includes semiconductor layers 106 and tunnel insulating layers 108, which are alternately and repeatedly stacked. An utmost top layer of the multiple tunnel junction pattern 110 may be either the semiconductor layer 106 or the tunnel insulating layer 108. The data line 122 is extended to be electrically connected with a plurality of adjacent memory cells. A gate interlayer dielectric layer 126 covers sidewalls of the multiple tunnel junction pattern 110 and the data line 122. The gate interlayer dielectric layer 126 also covers the data line 122.

A word line 128 is arranged on the gate interlayer dielectric layer 126 to cross over the data line 122. The word line 128 overlaps with the storage node 104 and the multiple tunnel junction pattern 110. The data line 122, the multiple tunnel junction pattern 110, the storage node 104 and the word line 128 form the vertical transistor. The data line 122 corresponds to a drain of the vertical transistor, and the storage node 104 corresponds to a source of the vertical transistor.

FIG. 2A illustrates an energy band diagram of a conventional semiconductor memory device, taken along line I–I' of FIG. 1.

FIG. 2B illustrates an energy band diagram of a conventional semiconductor memory device, taken along line II–II' of FIG. 1.

Referring to FIGS. 2A and 2B, the multiple tunnel junction pattern 110 of FIG. 1 has a plurality of high potential barriers provided by the tunnel insulating pattern 108. Generally, the semiconductor layer 106 is formed of an undoped silicon layer, and the word line 128 and the storage node 104 are formed of a P-type silicon layer and an N-type silicon layer, respectively. As illustrated in FIG. 2A, an accumulation layer is formed on sidewalls of the semiconductor layer 106 by an influence of the P-type word line 128. Therefore, the tunnel insulating pattern 108 adjacent to the gate dielectric layer 126 to a predetermined distance forms a relatively high potential barrier. As a result, in the stand-by mode, charges may leak out through a central region of the tunnel insulating pattern 108 having a relatively low potential barrier.

SUMMARY OF THE INVENTION

It is a feature of an embodiment of the present invention to provide a semiconductor memory device having a structure such that charge leakage through a multiple tunnel junction pattern may be significantly decreased and a method of fabricating the same.

It is another feature of an embodiment of the present invention to provide a semiconductor memory device having a decreased charge leakage and a high coupling ratio and a method of fabricating the same.

It is still another feature of an embodiment of the present invention to provide a semiconductor memory device having a superior read operation at a low read voltage and a method of fabricating the same.

In order to provide these and other features, an embodiment of the present invention is directed to a semiconductor memory device having a multiple tunnel junction pattern, wherein a cell of the semiconductor memory device includes a planar transistor and a vertical transistor. The planar transistor is arranged at a predetermined region of a semiconductor substrate, and includes a first and a second conductive region that are spaced apart from and parallel to each other, and a storage node arranged on a channel region between the first and the second conductive region. The vertical transistor includes the storage node, a multiple tunnel junction pattern arranged on the storage node, a data line crossing over the multiple tunnel junction pattern and parallel to the first and the second conductive region, and a word line crossing over the data line and covering both sidewalls of the multiple tunnel junction pattern and both sidewalls of the storage node. In a cross-sectional view taken along the word line, a width of the multiple tunnel junction pattern is narrower than a width of the storage node and a width of the data line. That is, the multiple tunnel junction pattern has a narrow width in a limited area. Thus, a leakage current flowing through a central region of the multiple tunnel junction pattern may be decreased.

Preferably, the multiple tunnel junction pattern may be formed by alternately and repeatedly stacking semiconductor patterns and tunnel insulating patterns. The semiconductor pattern is preferably formed of a material having a faster etch rate and thermal oxidizing rate than the storage node layer.

A gate insulating layer may be interposed between the storage node and the channel region. A gate interlayer dielectric layer may be interposed between the word line and the multiple tunnel junction pattern, and between the word line and the storage node. The storage node corresponds to a gate electrode of the planar transistor and simultaneously corresponds to a source of the vertical transistor. Thus, since the storage node protrudes from both sidewalls of the multiple tunnel junction pattern, capacitance between the word line and the storage node may be maximized. A capping insulating pattern may be interposed between the word line and the data line.

In another embodiment of the present invention, a semiconductor memory device includes a plurality of conductive regions parallel to a semiconductor substrate; a plurality of storage nodes arranged on the semiconductor substrate between the conductive regions; trench regions formed at the semiconductor substrate between the storage nodes arranged on a line parallel to the conductive regions; a plurality of multiple tunnel junction patterns stacked on the storage nodes; isolation layers for filling the trench regions; a plurality of data lines arranged between the conductive regions for covering the multiple tunnel junction patterns and the isolation layers therebetween; and a plurality of parallel word lines for crossing over the data lines, wherein a width of the multiple tunnel junction pattern is narrower than widths of the data line and the storage node in a cross-sectional view taken along the word line, and the word lines for covering sidewalls of the storage nodes and the multiple tunnel junction patterns.

A method of forming the semiconductor memory device according to an embodiment of the present invention, includes forming a plurality of trench regions two-dimensionally arranged at a predetermined region of a semiconductor substrate along a row direction and a column direction, to define a mesh-shaped active region, and simultaneously sequentially stacking a gate insulating layer, a storage node layer and a multiple tunnel junction layer on the mesh-shaped active region, the multiple tunnel junction layer including semiconductor layers and tunnel insulating layers that are alternately and repeatedly stacked, and the semiconductor layer formed of a material having a faster etch rate or thermal oxidizing rate than the storage node layer; forming a plurality of island-shaped isolation patterns to fill the trench regions; forming an interconnection layer on an entire surface of the resultant structure where the isolation patterns are formed; continuously patterning the interconnection layer, the multiple tunnel junction layer, the storage node layer and the gate insulating layer to form a plurality of data lines parallel to the column direction and simultaneously sequentially stacking a gate insulating pattern, a storage node pattern and a multiple tunnel junction pattern in regions between the isolation layers under the data lines, wherein a width of the multiple tunnel junction pattern is narrower than widths of the storage node pattern and the data line in a cross-sectional view taken along the row direction; forming a conformal gate interlayer dielectric layer on an entire surface of the resultant structure having the storage node pattern; and forming a plurality of parallel word lines for crossing over the data lines on the gate interlayer dielectric layer. The storage node layer may be formed of a silicon layer and the semiconductor layer may be formed of a silicon germanium layer (SiGe).

After forming the storage node, conductive regions may be formed at a semiconductor substrate located at both sides of the storage node by implanting impurities therein.

BRIEF DESCRIPTION OF THE DRAWINGS

The above and other features and advantages of the present invention will become more apparent upon review of a detailed description of preferred embodiments thereof with reference to the attached drawings in which:

FIG. 4B illustrates a cross-sectional view depicting a semiconductor memory device according to a preferred embodiment of the present invention, taken along line IV–IV' of FIG. 3.

DETAILED DESCRIPTION OF THE INVENTION

Korean Patent Application No. 2001-61370, filed on Oct. 5, 2001, and entitled: "Semiconductor Memory Device Having a Multiple Tunnel Junction Pattern and Method of Fabricating the Same," is incorporated by reference herein in its entirety.

The present invention will be described more fully hereinafter with reference to the accompanying drawings, in which preferred embodiments of the present invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the attached figures, the thickness of layers and regions is exaggerated for clarity. Also, when it is mentioned that a layer is 'on' another layer or a substrate, the layer may be formed directly on another layer or on a substrate, or a third layer may be interposed therebetween. Like reference numbers indicate like components throughout the specification and drawing figures.

Figure 1:
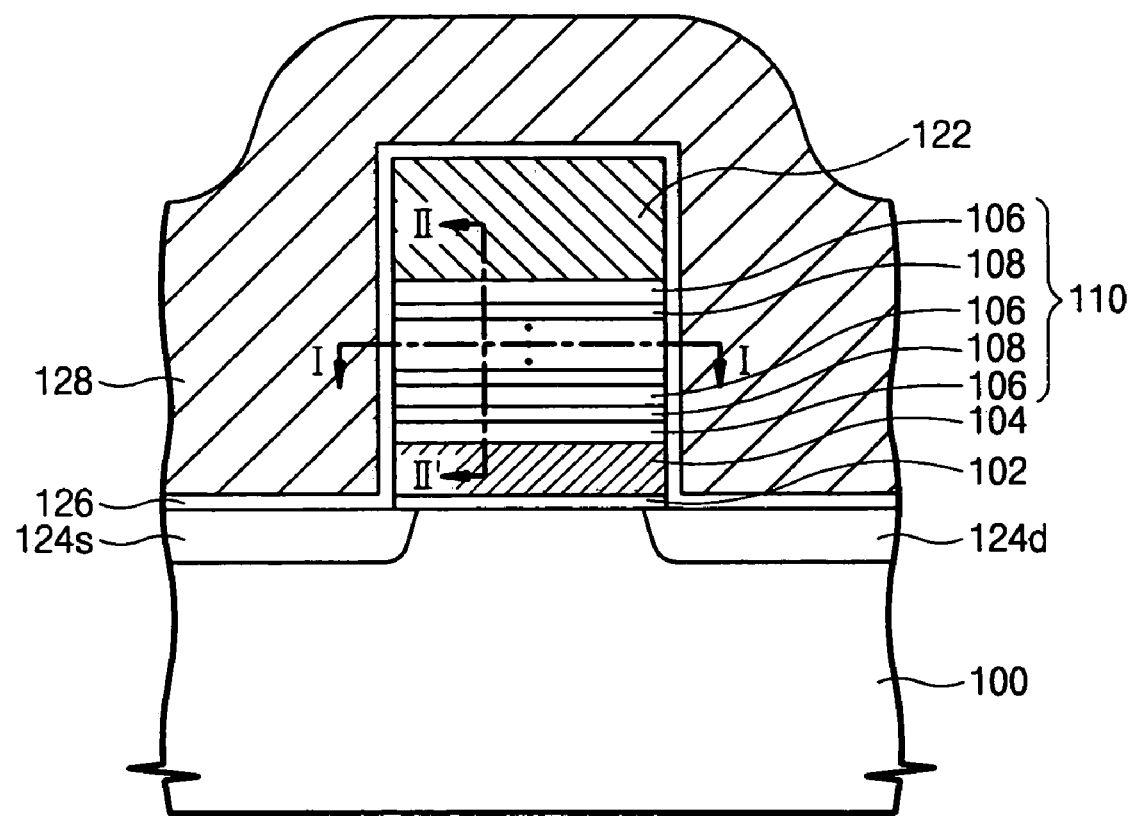
FIG. 1 illustrates a cross-sectional diagram depicting a semiconductor memory device.
Figure 2A:
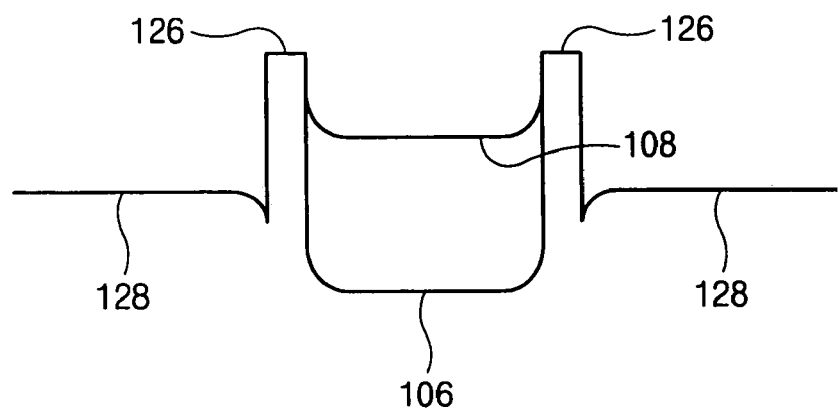
FIG. 2A illustrates an energy band diagram of a conventional semiconductor memory device, taken along line I–I' of FIG. 1.
Figure 2B:
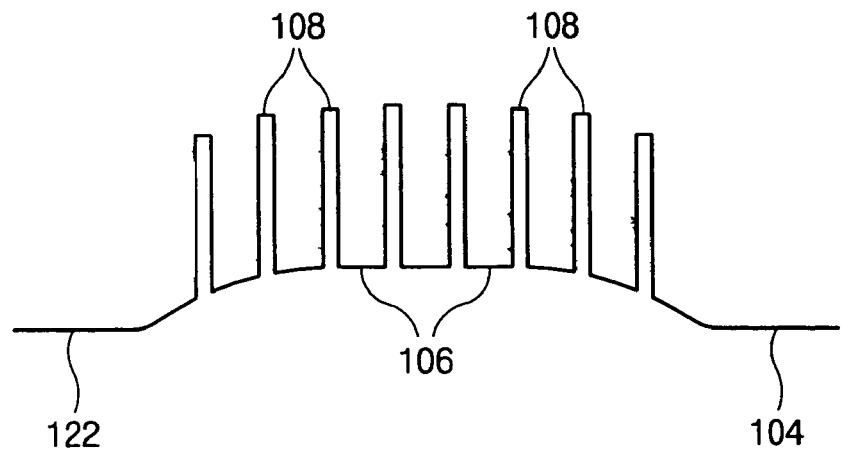
FIG. 2B illustrates an energy band diagram of a conventional semiconductor memory device, taken along line II–II' of FIG. 1.
Figure 3:
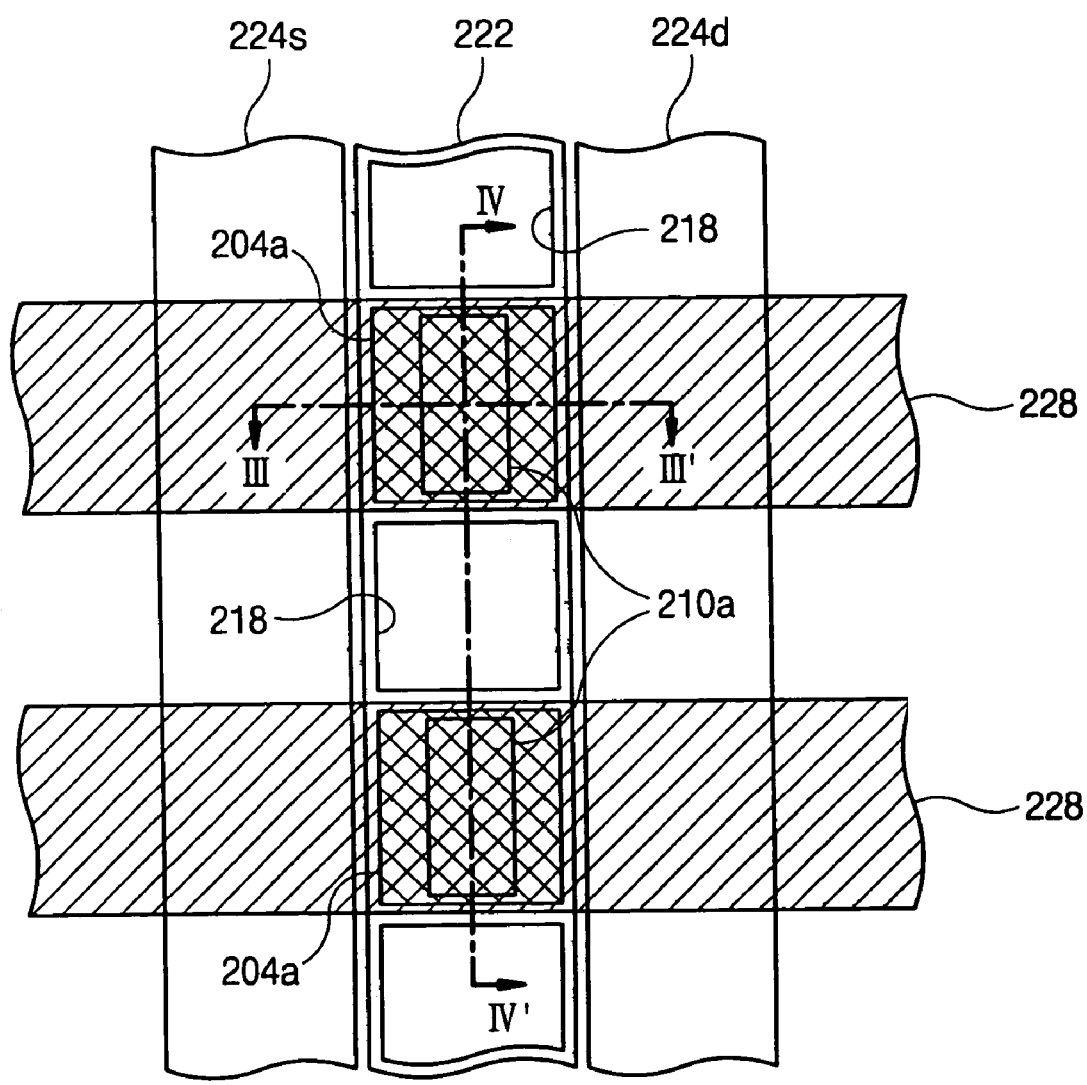
FIG. 3 illustrates a plan view depicting a semiconductor memory device according to a preferred embodiment of the present invention.
Figure 4A:
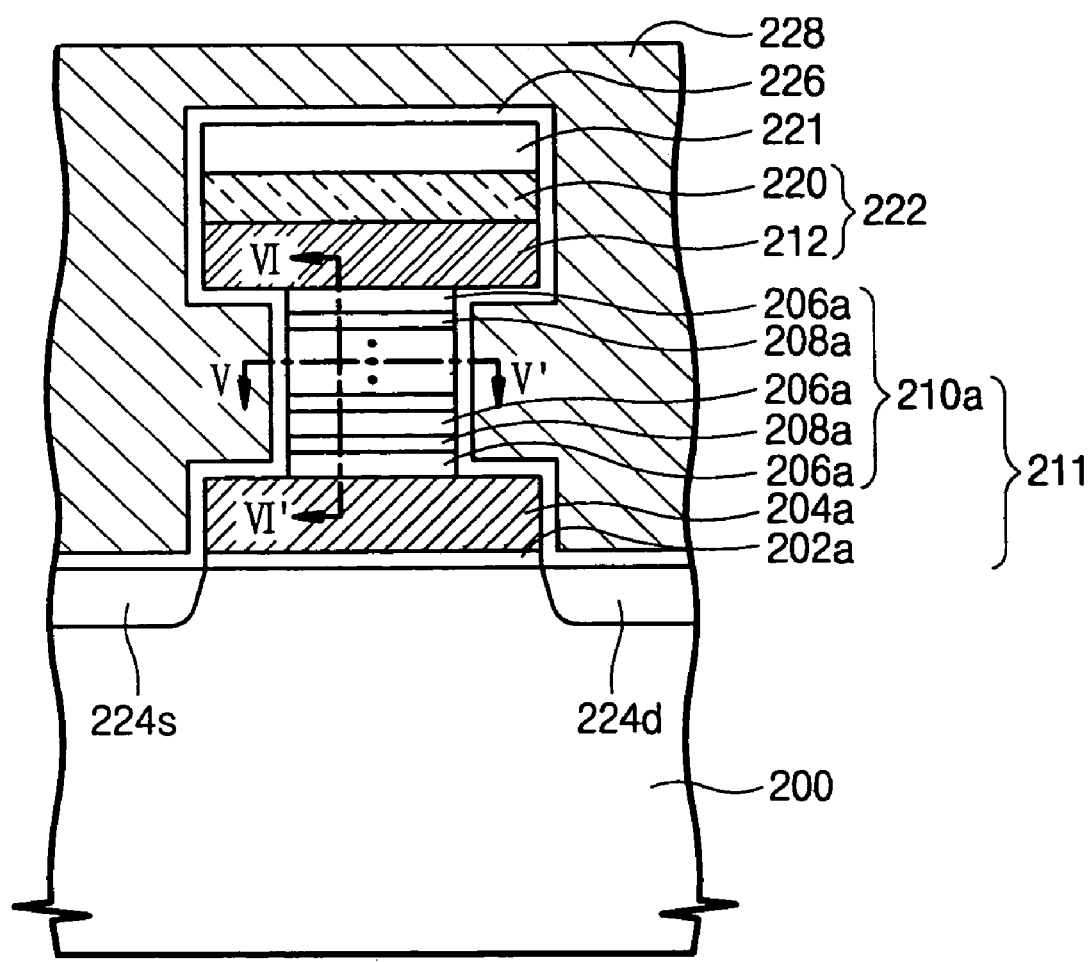
FIG. 4A illustrates a cross-sectional view depicting a semiconductor memory device according to a preferred embodiment of the present invention, taken along line III–III' of FIG. 3.

Referring to FIGS. 3, 4A, and 4B, a first conductive region 224d and a second conductive region 224s, which are parallel to each other, are arranged at a predetermined region of a semiconductor substrate 200. The first and second conductive regions 224d and 224s are parallel to a column direction. The first conductive region 224d acts as a bit line, and is connected with a sense amplifier (not illustrated). A plurality of multiple layered patterns 211 are arranged along the column direction on the semiconductor substrate 200 between the first and second conductive regions 224d and 224s. Regions between the multiple layered patterns 211 are filled with isolation patterns 218. Each isolation pattern 218 is extended into the semiconductor substrate 200 to perfectly isolate adjacent multiple layered patterns 211. Each of the multiple layered patterns 211 includes a gate insulating pattern 202a, a storage node 204a and a multiple tunnel junction pattern 210a which are sequentially stacked.

The multiple tunnel junction pattern 210a includes semiconductor patterns 206a and tunnel insulating patterns 208a which are alternately and repeatedly stacked. An utmost top layer of the multiple tunnel junction pattern 210a may either be the tunnel insulating pattern 208a or the semiconductor pattern 206a.

A data line 222 is arranged on the multiple tunnel junction patterns 210a, and on the isolation pattern 218 therebetween. Thus, the data line 222 is arranged between the first and second conductive regions 224d and 224s. A capping insulating pattern 221 may be arranged on the data line 222. The data line 222 may include an interconnection 220 under the capping insulating pattern 221, and an upper conductive pattern 212 interposed between the interconnection 220 and the multiple tunnel junction layer 210a. If the interconnection 220 is formed of a doped silicon or a polycide, the process of forming the upper conductive layer 212 may be omitted.

A plurality of parallel word lines 228 are arranged to cross over the data line 222. Each of the word lines 228 covers both sides of the storage node 204a and the multiple tunnel junction pattern 210a. A conformal gate interlayer dielectric layer 226 is interposed between the word lines 228 and sidewalls of the storage nodes 204a, and between the word lines 228 and sidewalls of the multiple tunnel junction patterns 210a. Preferably, the word lines 228 are P-type silicon layers and the storage nodes 204a are N-type silicon layers. Also, the semiconductor pattern 206a is preferably an intrinsic-semiconductor layer. For example, the semiconductor pattern 206a may be made of SiGe (silicon germanium).

In FIG. 4A, a width of the multiple tunnel junction pattern 210a is narrower than that of the storage node 204a or the data line 222. Thus, at both sides of the multiple tunnel junction pattern 210, top surfaces of the storage node 204a are overlapped with the word line 228 to provide a high capacitance between the storage node 204a and the word line 228.

A method of operating a cell of the described semiconductor memory device will now be explained.

First, in a write mode, a data voltage is applied on the data line 222 and a write voltage is applied on the word line 228. Thus, an inversion channel is formed on sidewalls of the semiconductor patterns 206a near the word line 228 and a tunneling current flows through the tunnel insulating patterns 208a. As a result, according to the voltage applied on the data line 222, electrons or holes are stored in the storage node 204a. The stored charges change a threshold voltage of the planar transistor.

Next, in order to read out information stored in the storage node, a read voltage is applied on the word line, and a proper voltage, e.g., a ground voltage, is applied on the second conductive region 224s. Thus, in the case that the threshold voltage of the planar transistor is higher than the read voltage, the planar transistor is turned off. On the contrary, in the case that the threshold voltage of the planar transistor is lower than the read voltage, the planar transistor is turned on. At this time, if an overlapped area between the storage node 204a and the word line 228 is increased, a voltage coupled to the storage node 204a approaches the voltage applied on the word line 228. As a result, the read voltage may be lowered.

Figure 5A:
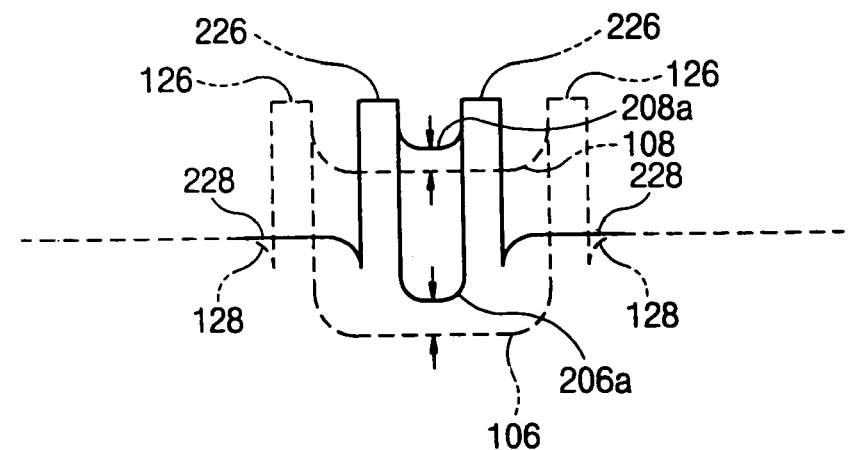
FIG. 5A illustrates an energy band diagram of a semiconductor memory device according to a preferred embodiment of the present invention, taken along line V–V' of FIG. 4A.
Figure 5B:
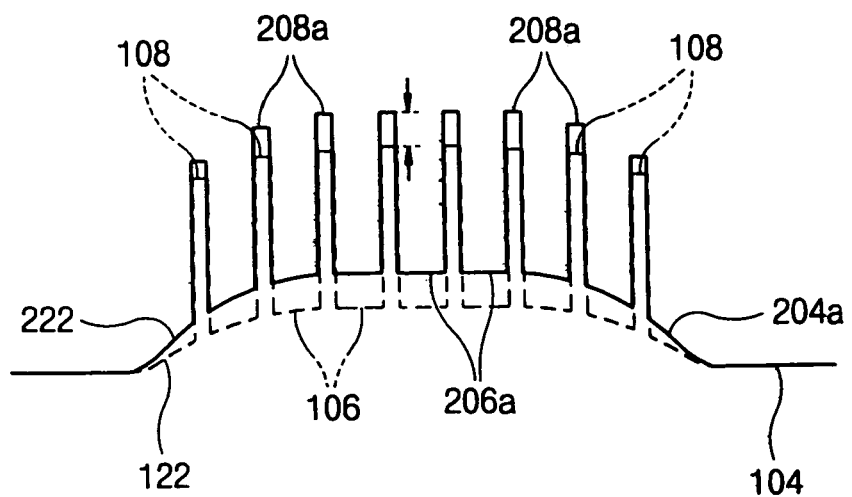
FIG. 5B illustrates an energy band diagram of a semiconductor memory device according to a preferred embodiment of the present invention, taken along line VI–VI' of FIG. 4A.

FIG. 5A illustrates an energy band diagram of a semiconductor memory device according to a preferred embodiment of the present invention, taken along a line of V–V' of FIG. 4A. FIG. 5B illustrates an energy band diagram of a semiconductor memory device according to a preferred embodiment of the present invention, taken along line VI–VI' of FIG. 4A.

In FIGS. 5A and 5B, parts represented with dotted lines indicate a case wherein a multiple tunnel junction layer is wide, and parts represented with solid lines indicate a contrary case wherein a multiple tunnel junction layer is narrow.

Referring to FIGS. 5A and 5B, by an influence of the word line 228 of the P-type tunnel silicon layer, accumulation layers are formed at both sides of the semiconductor pattern 206a of the intrinsic semiconductor. In the case wherein the semiconductor pattern 206a is narrower than that of the accumulation layers, an energy band of the semiconductor pattern 206a mostly has a high potential. An energy level of the tunnel insulating pattern 208a is also increased according to the energy level of the semiconductor pattern 206a. Thus, charge leakage of tunneling through the tunnel insulating pattern 208a is remarkably decreased. In order to increase the potential so that it is sufficiently high, a width of the semiconductor pattern 210a of FIGS. 3, 4A and 4B is preferably below 0.1 μm.

Consequently, according to the present invention, a leakage current between a source and a drain of a vertical transistor may be prevented and capacitance between a storage node and a word line may be maximized in a limited region.

Embodiment 1

Figure 6A:
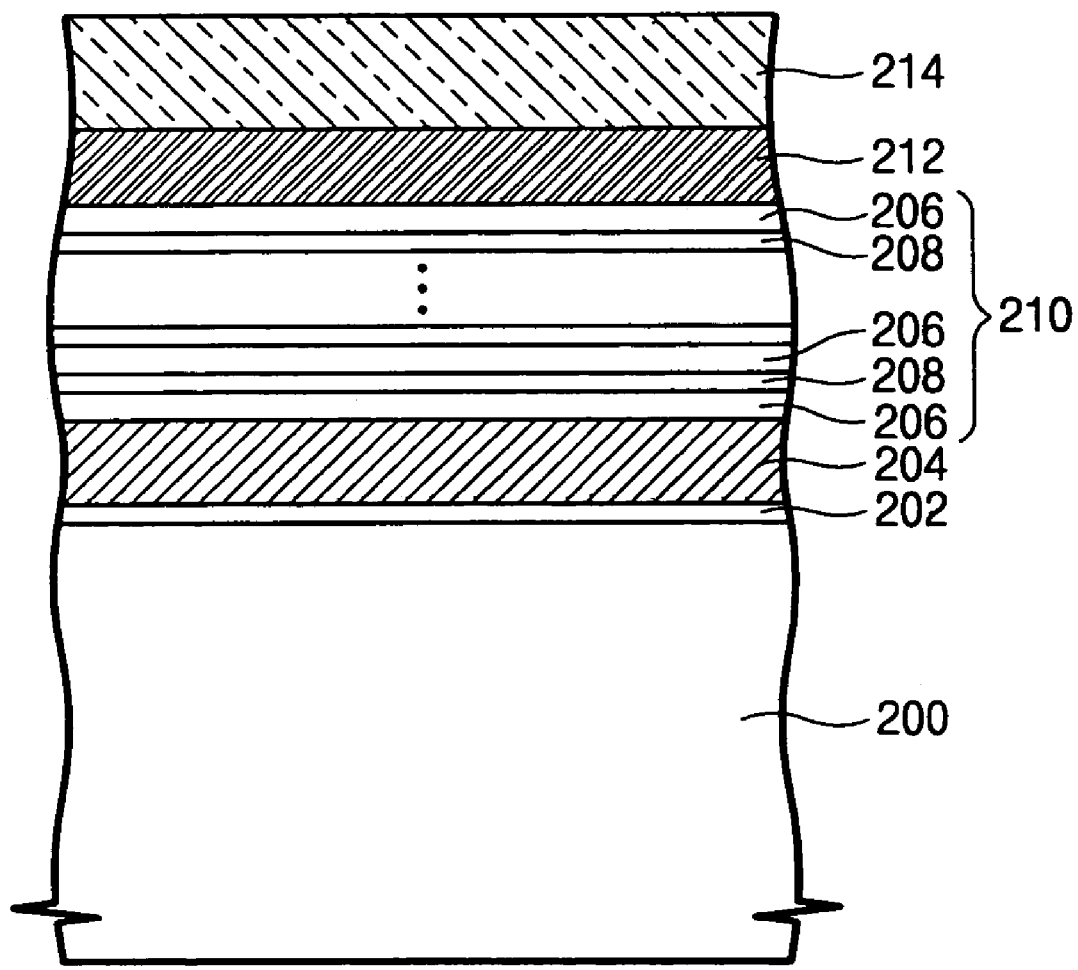
FIGS. 6A, 7A, 8A, 9A, and 10A illustrate cross-sectional views depicting stages in the manufacture of a semiconductor memory device according to a first preferred embodiment of the present invention, taken along line III–III' of FIG. 3.
Figure 6B:
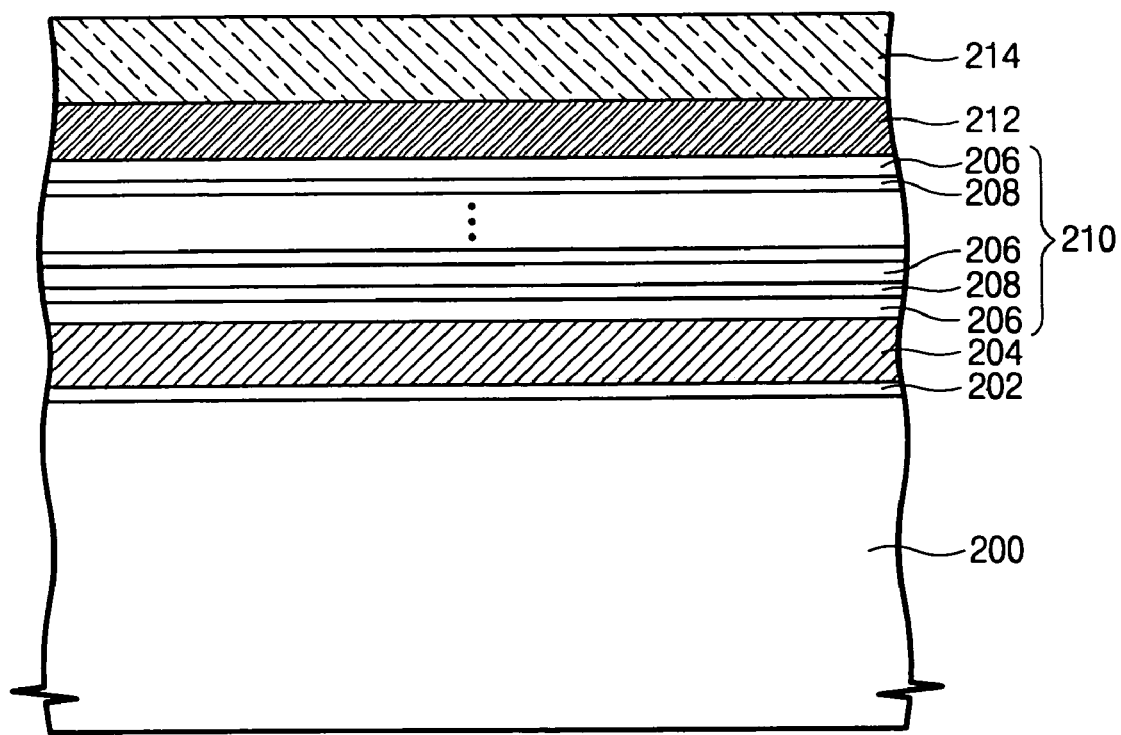
FIGS. 6B, 7B, 8B, 9B, and 10B illustrate cross-sectional views depicting stages in the manufacture of a semiconductor memory device according to a first preferred embodiment of the present invention, taken along line IV–IV' of FIG. 3.

Referring to FIGS. 6A and 6B, a gate insulating layer 202, a storage node layer 204, a multiple tunnel junction layer 210, and a chemical mechanical polishing (CMP) stop layer 214 are formed on a semiconductor substrate 200. The multiple tunnel junction layer 210 is formed by alternately and repeatedly stacking semiconductor layers 206 and tunnel insulating layers 208. The semiconductor layer 206 is preferably formed of a material having a faster etch rate and higher thermal oxidizing rate than the storage node layer 204, e.g., a silicon germanium layer. Also, the tunnel insulating layer 208 is preferably formed of silicon nitride. Before forming the CMP stop layer 214, an upper conductive layer 212 may be further formed at an entire surface of the multiple tunnel junction layer 210. The upper conductive layer 212 and the storage node layer 204 are preferably formed of P-type doped silicon layers. An utmost bottom layer and an utmost top layer of the multiple tunnel junction layer 210 may be formed of either a semiconductor layer 206 or tunnel insulating layer 208, respectively.

Figure 7A:
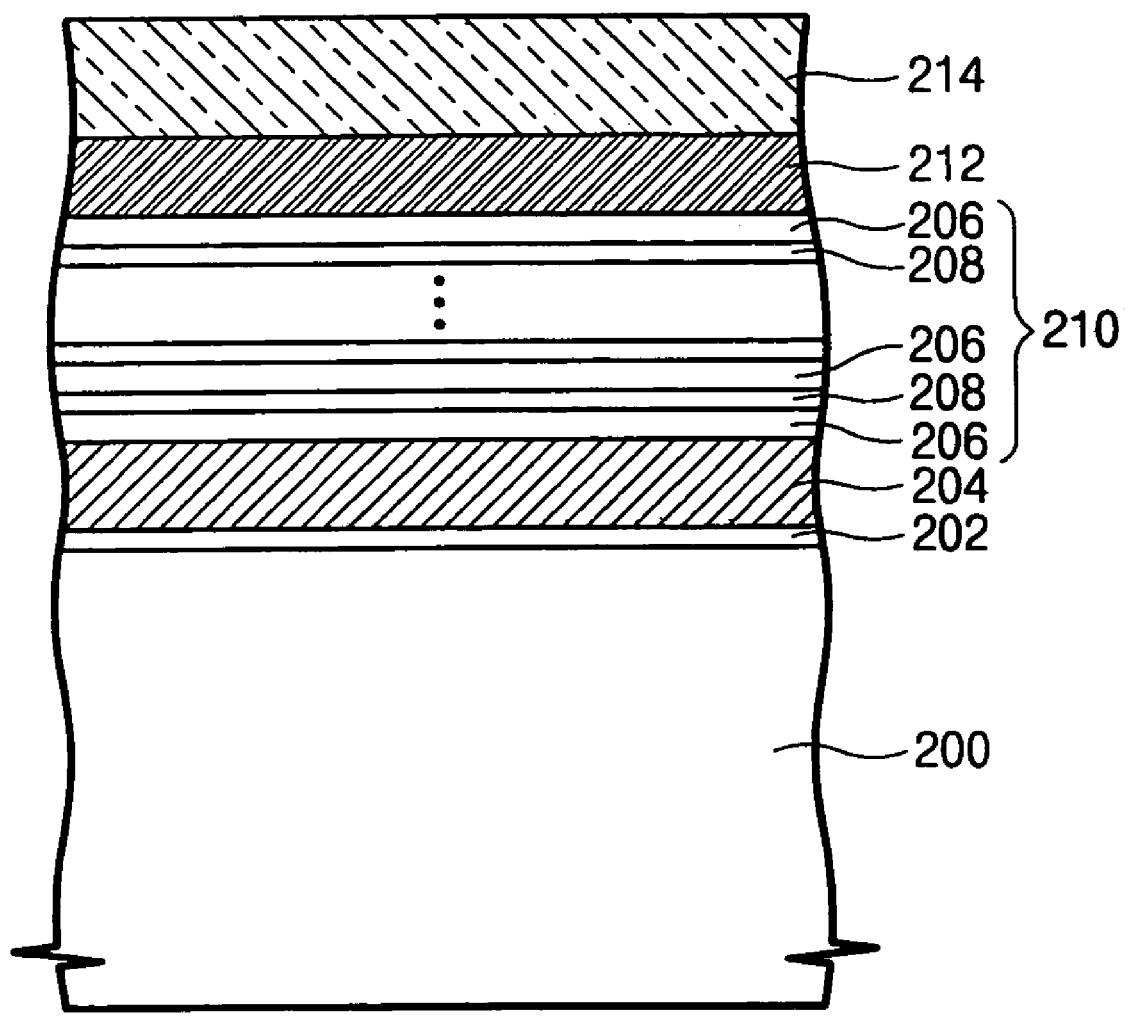
Figure 7B:
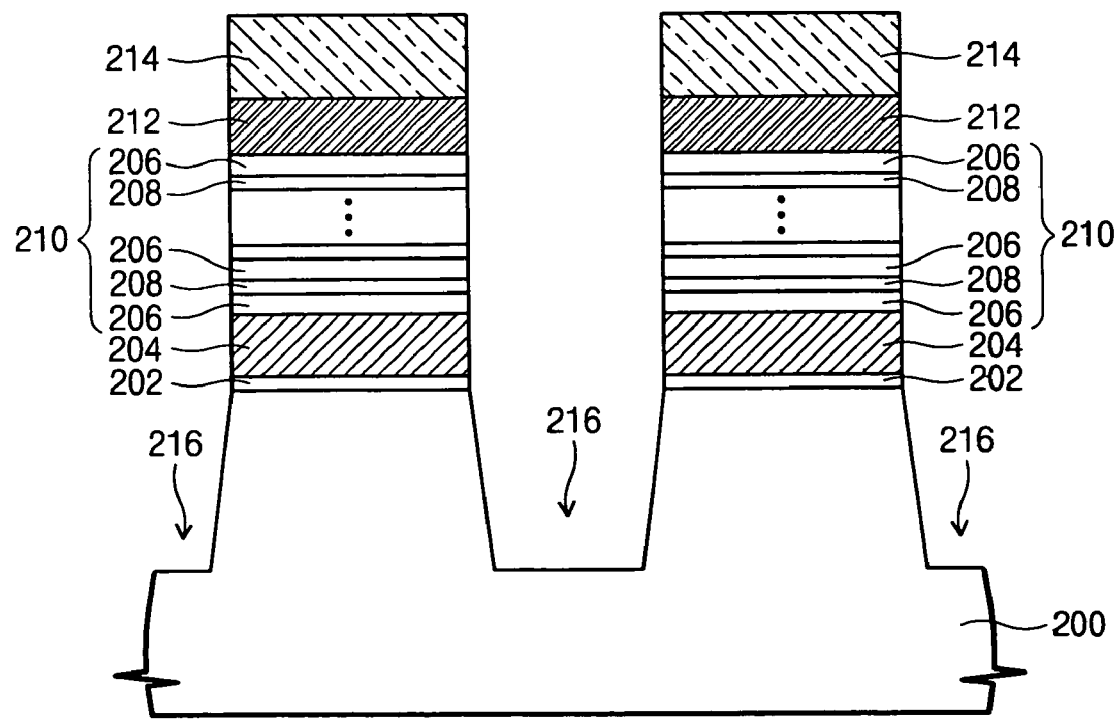

Referring to FIGS. 7A and 7B, the CMP stop layer 214, the upper conductive layer 212, the multiple tunnel junction layer 210, the storage node layer 204, the gate insulating layer 202, and the semiconductor substrate 200 are sequentially patterned to form a plurality of trench regions 216 which are two-dimensionally arranged along a row direction and a column direction. The trench regions 216 define a mesh-shaped active region at the semiconductor substrate 200.

Figure 8A:
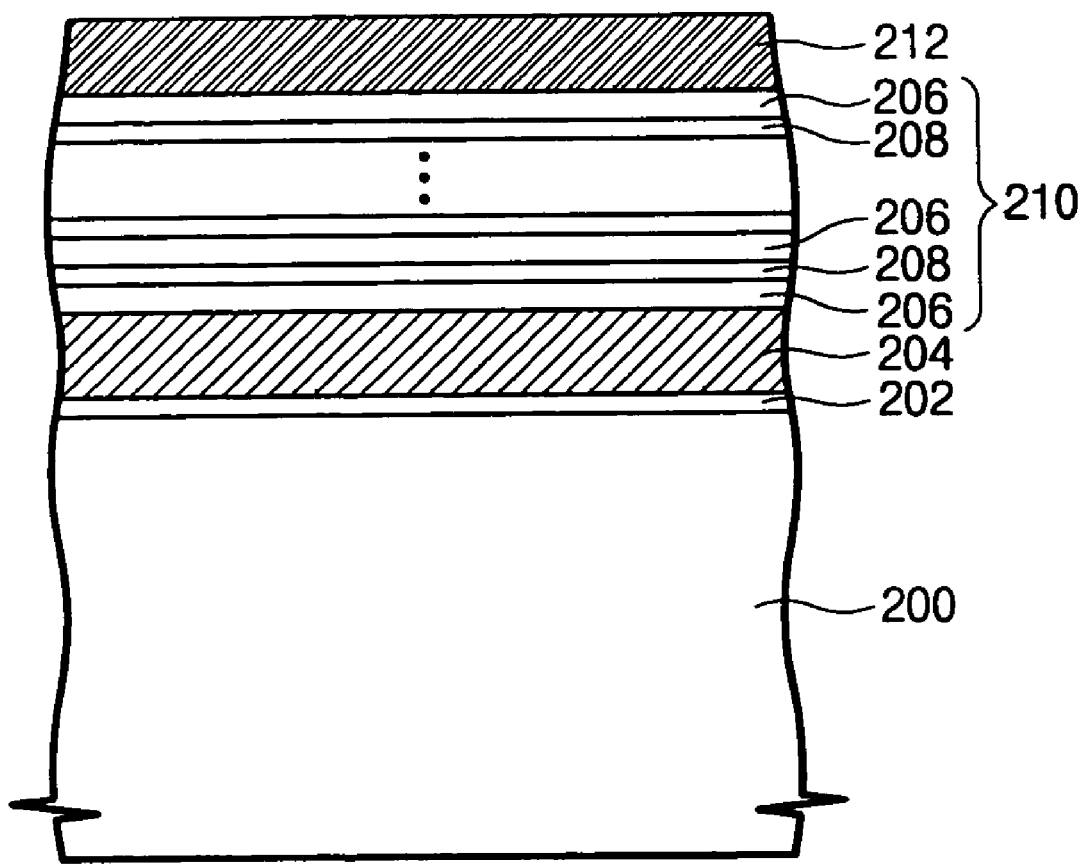
Figure 8B:
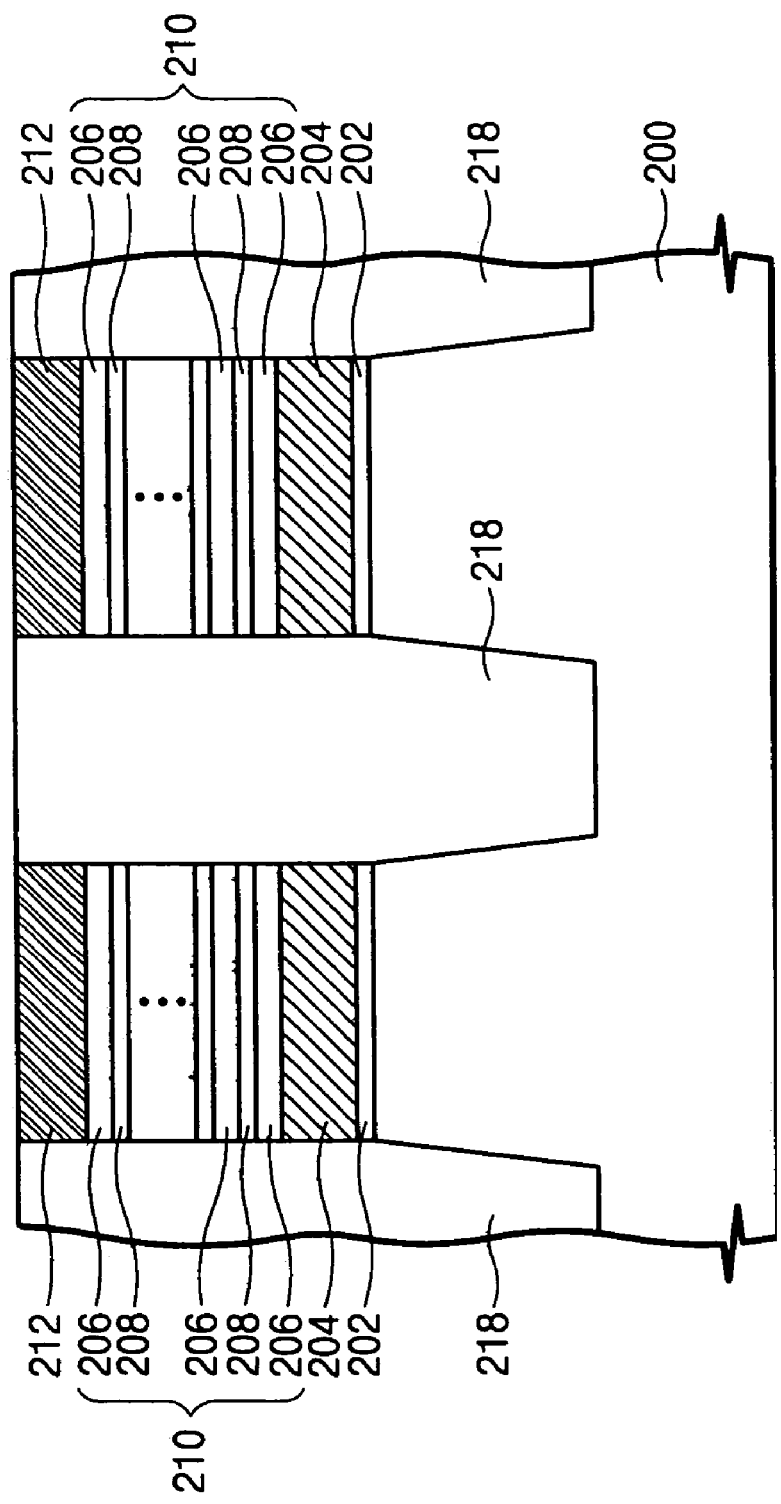

Referring to FIGS. 8A and 8B, an isolation layer is formed at an entire surface of the semiconductor substrate having the trench regions 216, thereby filling the trench regions. The isolation layer is entirely etched to expose the CMP stop layer 214, thereby forming a plurality of island-shaped isolation patterns 218 filling the trench regions 216. Consequently, the isolation patterns 218 are two-dimensionally arranged along a row direction and a column direction. The process of entirely etching the isolation layer is preferably performed by using a CMP process. Then, the exposed CMP stop layer 214 is removed to expose the upper conductive layer 212.

Figure 9A:
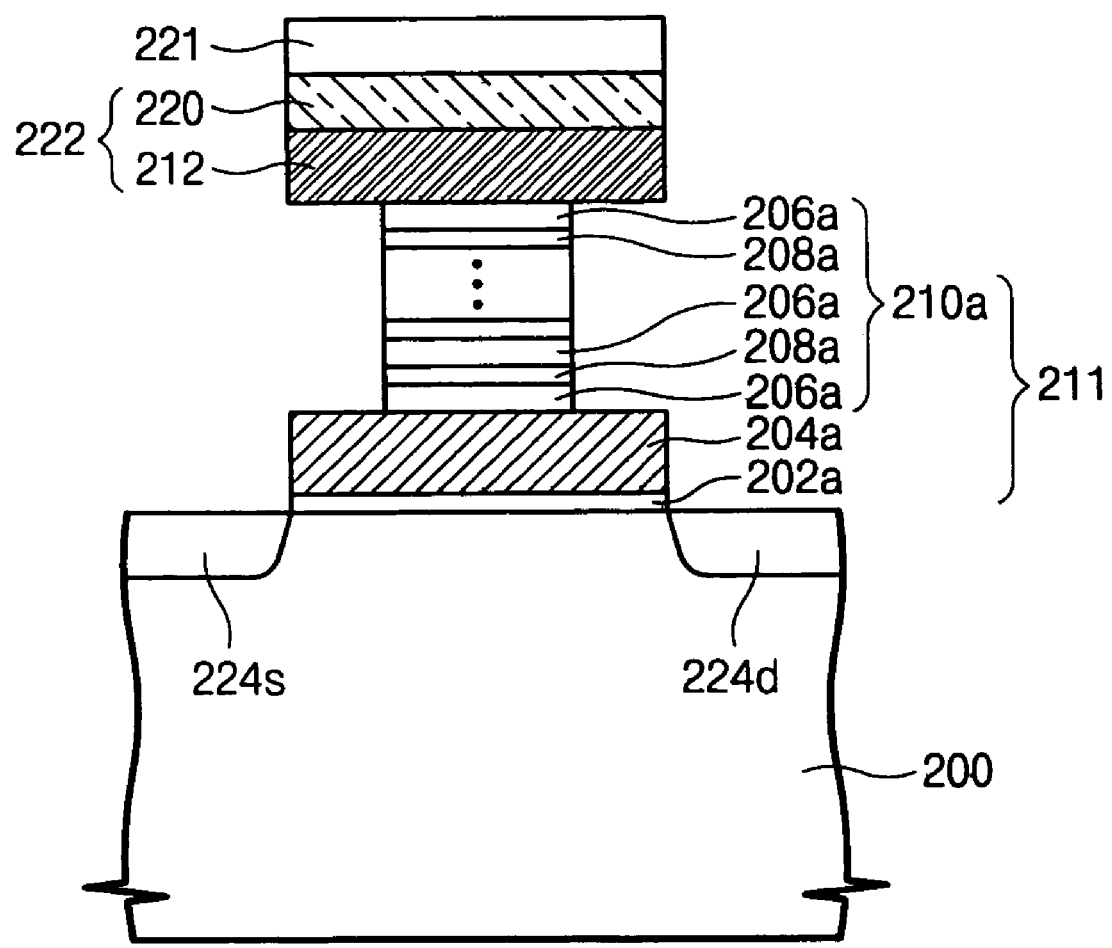
Figure 9B:
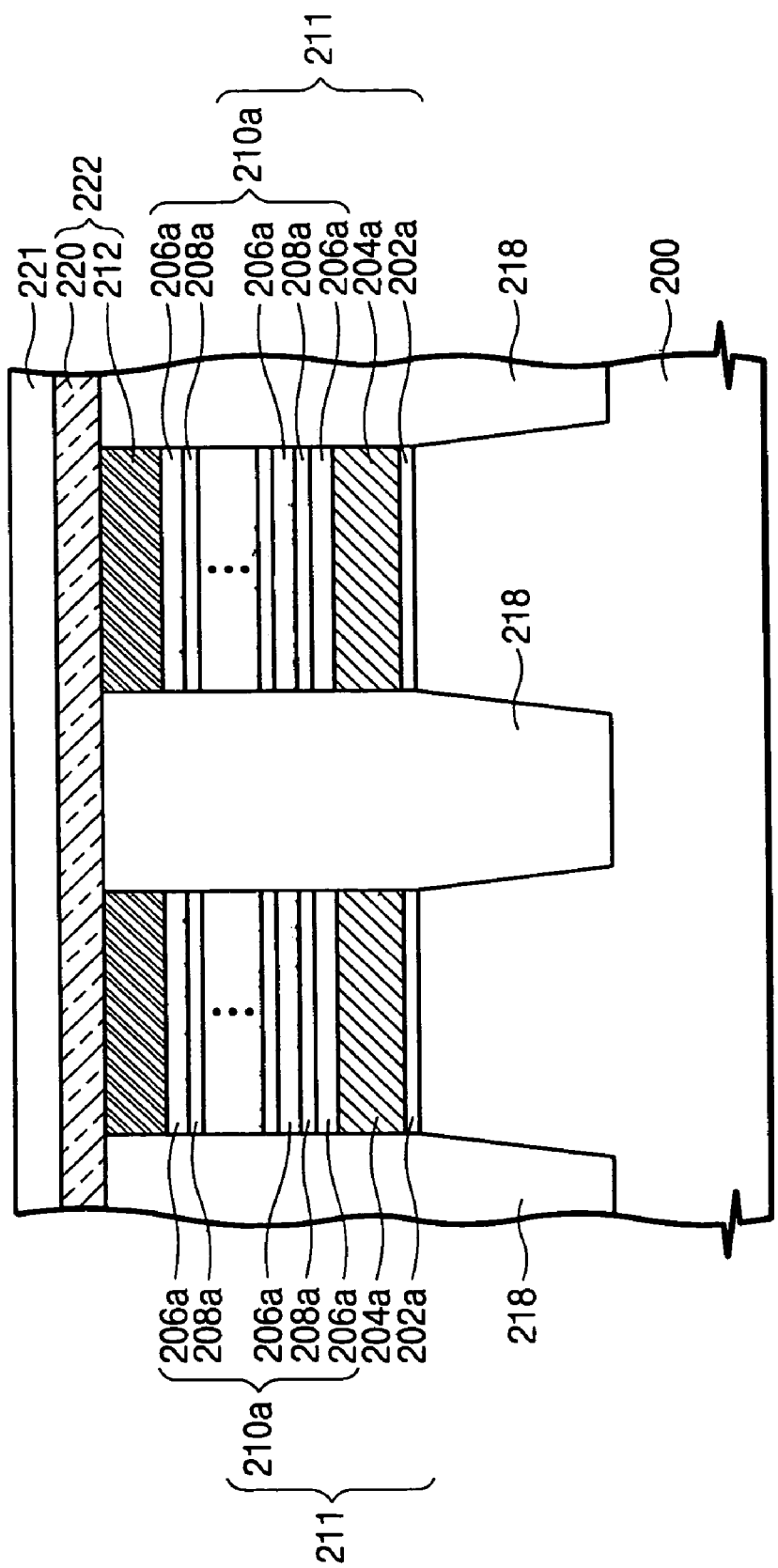

Referring to FIGS. 9A and 9B, an interconnection layer and a capping insulating layer are sequentially formed on the entire surface of the resultant structure where the upper conductive layer 212 is exposed. The interconnection layer is preferably formed from a metal layer, a polycide layer or a doped silicon layer, and the capping insulating layer is preferably formed from a silicon oxide layer or a silicon nitride layer. The capping insulating layer, the interconnection layer and the upper conductive layer 212 are continuously patterned to form a plurality of capping insulating patterns 221 parallel to the column direction and a plurality of data lines 222 under the capping insulation patterns 221.

Each of the data lines 222 covers the isolation patterns 218 which are located on a straight line parallel to the column direction. Each of the data lines 222 is composed of an interconnection 220 under the capping insulating pattern 221, and an upper conductive pattern 212 interposed between the interconnection 220 and the multiple tunnel junction layer 210. In the case that the interconnection layer is formed from a doped silicon layer or a polycide layer, the process of forming the upper conductive layer 212 may be omitted. Continuously, the multiple tunnel junction layer 210, the storage node layer 204 and the gate insulating layer 202 exposed between the data lines 222 are continuously etched to form a plurality of multiple layered patterns 211 composed of a gate insulating pattern 202a, a storage node 204a and a multiple tunnel junction pattern 210a, between the isolation patterns 218 under the data lines 222. In this process, because the multiple tunnel junction pattern 210a has a faster etch rate than that of the interconnection layer, the upper conductive layer 212 and the storage node layer 204, the multiple tunnel junction pattern 210a has a narrower width than the data lines 222 and the storage nodes 204a in FIG. 9A. Each of the multiple tunnel junction patterns 210a is composed of semiconductor patterns 206a and tunnel insulating patterns 208a, which are alternately and repeatedly stacked. Continuously, impurities are implanted into the semiconductor substrate 200 between the data lines 222 to form a plurality of parallel conductive regions, i.e., first and second conductive regions 224d and 224s.

Figure 10A:
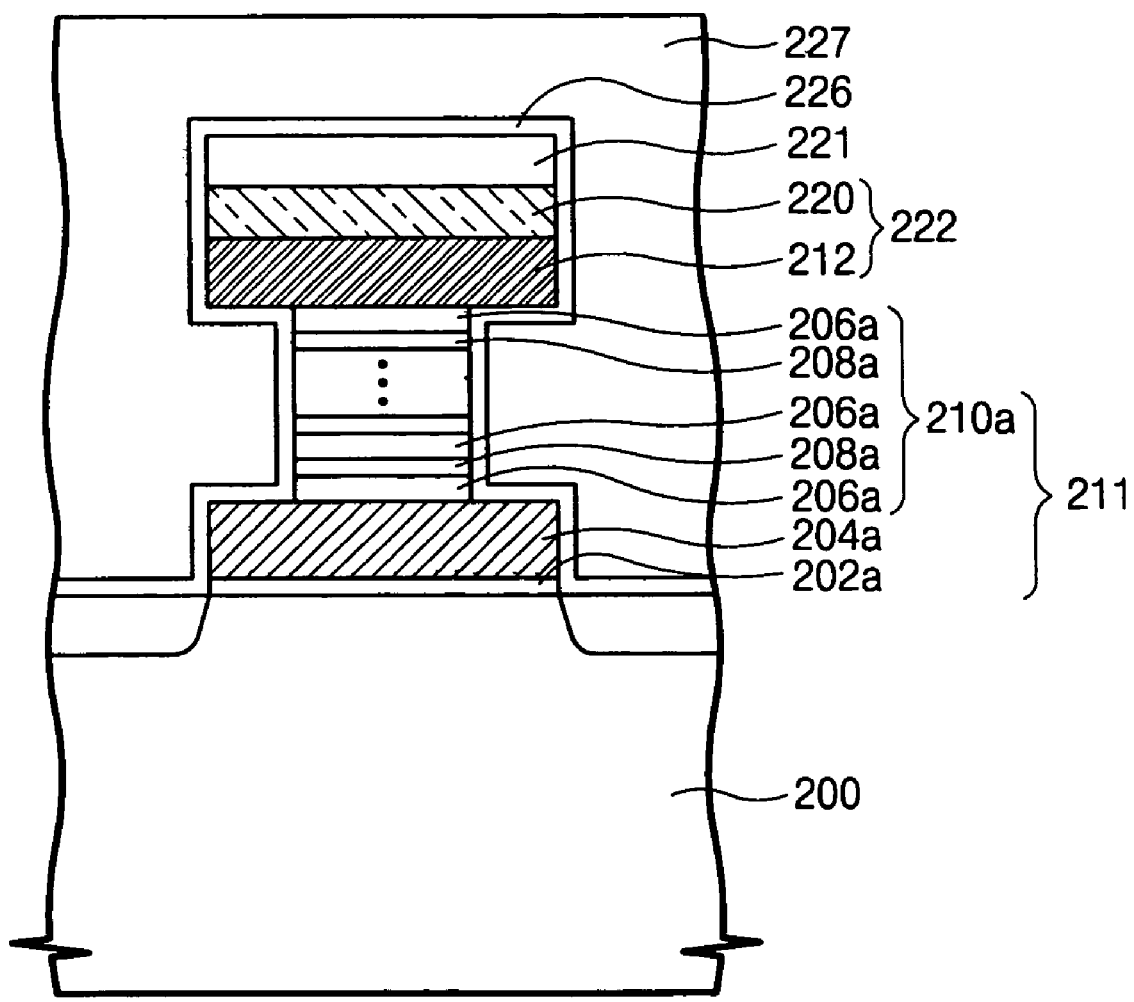
Figure 10B:
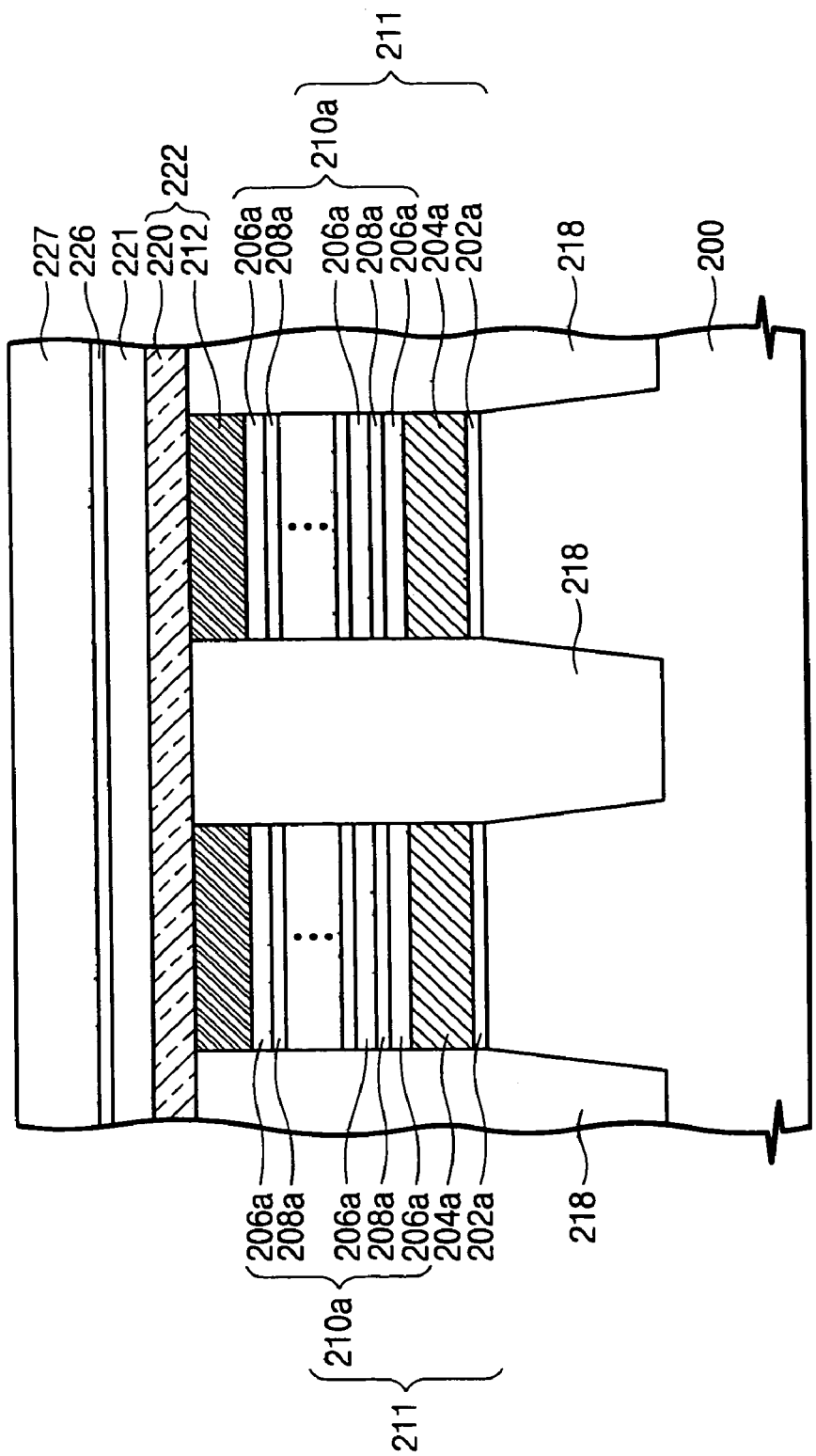

Referring to FIGS. 10A and 10B, a gate interlayer dielectric layer 226 is conformally formed on the entire surface of the resultant structure where the first and second conductive regions 224d and 224s are formed. The gate interlayer dielectric layer 226 at both sidewalls of the multiple layered patterns 211 corresponds to a gate insulating layer of a vertical transistor. The gate interlayer dielectric layer 226 may be formed of a silicon oxide layer and a silicon nitride layer, or a combination layer thereof. An etch stopping layer may be additionally formed on the gate interlayer dielectric layer 226. For example, in the case that the gate interlayer dielectric layer 226 is formed of a silicon oxide layer, the silicon nitride layer may be additionally formed. An interlayer dielectric layer 227 may be formed on the entire surface of the semiconductor substrate having the gate interlayer dielectric layer 226 and the etch stopping layer.

Then, although not shown in the figure, the interlayer dielectric layer 227 is patterned until the etch stopping layer is exposed, thereby forming a plurality of grooves crossing over the data lines 222, on the active region between the isolation patterns 218. Next, the exposed etch stopping layer is etched to expose the gate interlayer dielectric layer 226. Alternatively, the gate interlayer dielectric layer 226 may be formed after forming the groove. A plurality of word lines 228 as shown in FIGS. 3, 4A and 4B, are formed in the plurality of grooves using a conventional damascene process. Each of the word lines 228 covers both sides of the storage nodes 204a and the sides of the multiple tunnel junction patterns 210a.

Embodiment 2

Figure 11A:
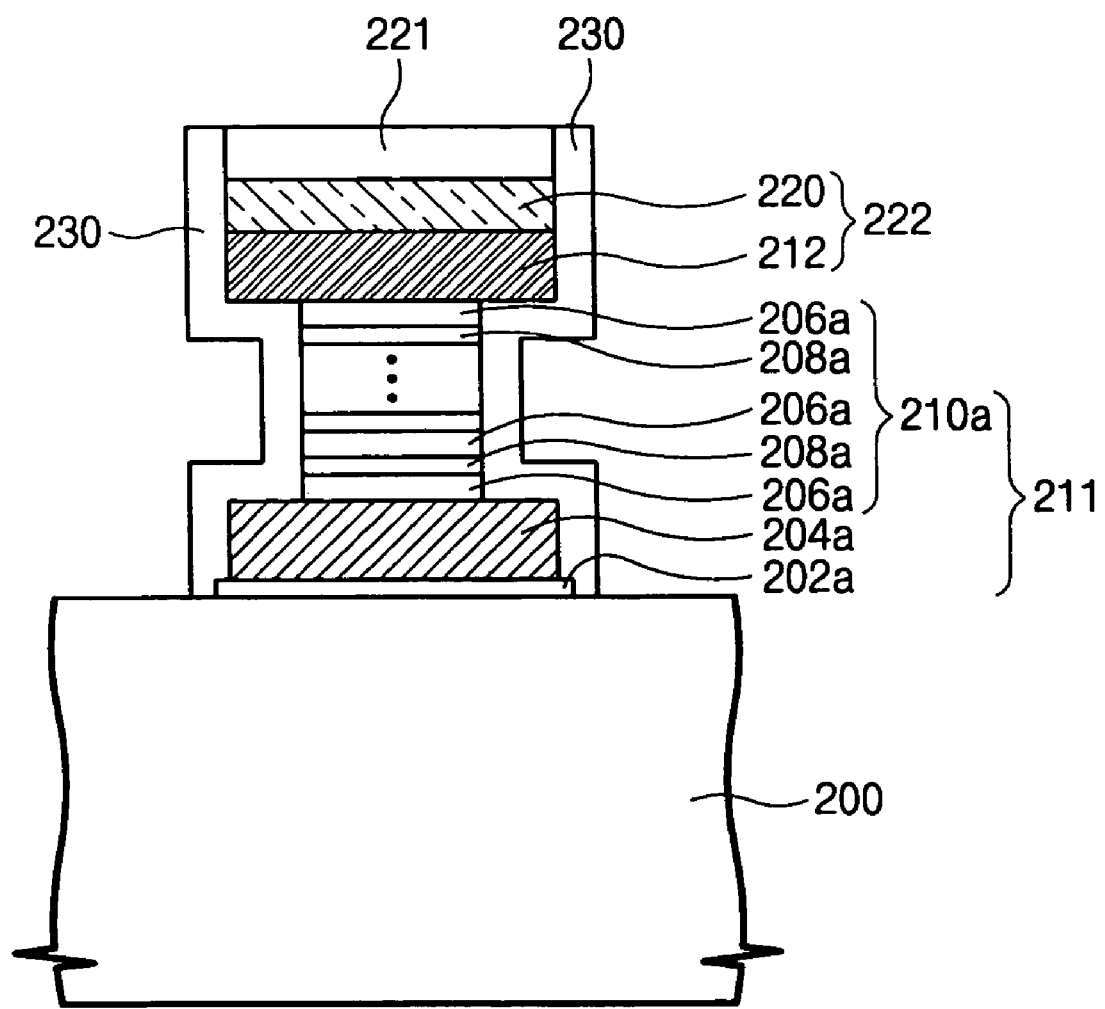
FIG. 11A illustrates a cross-sectional view depicting a semiconductor memory device according to a second preferred embodiment of the present invention, taken along line III–III' of FIG. 3.
Figure 11B:
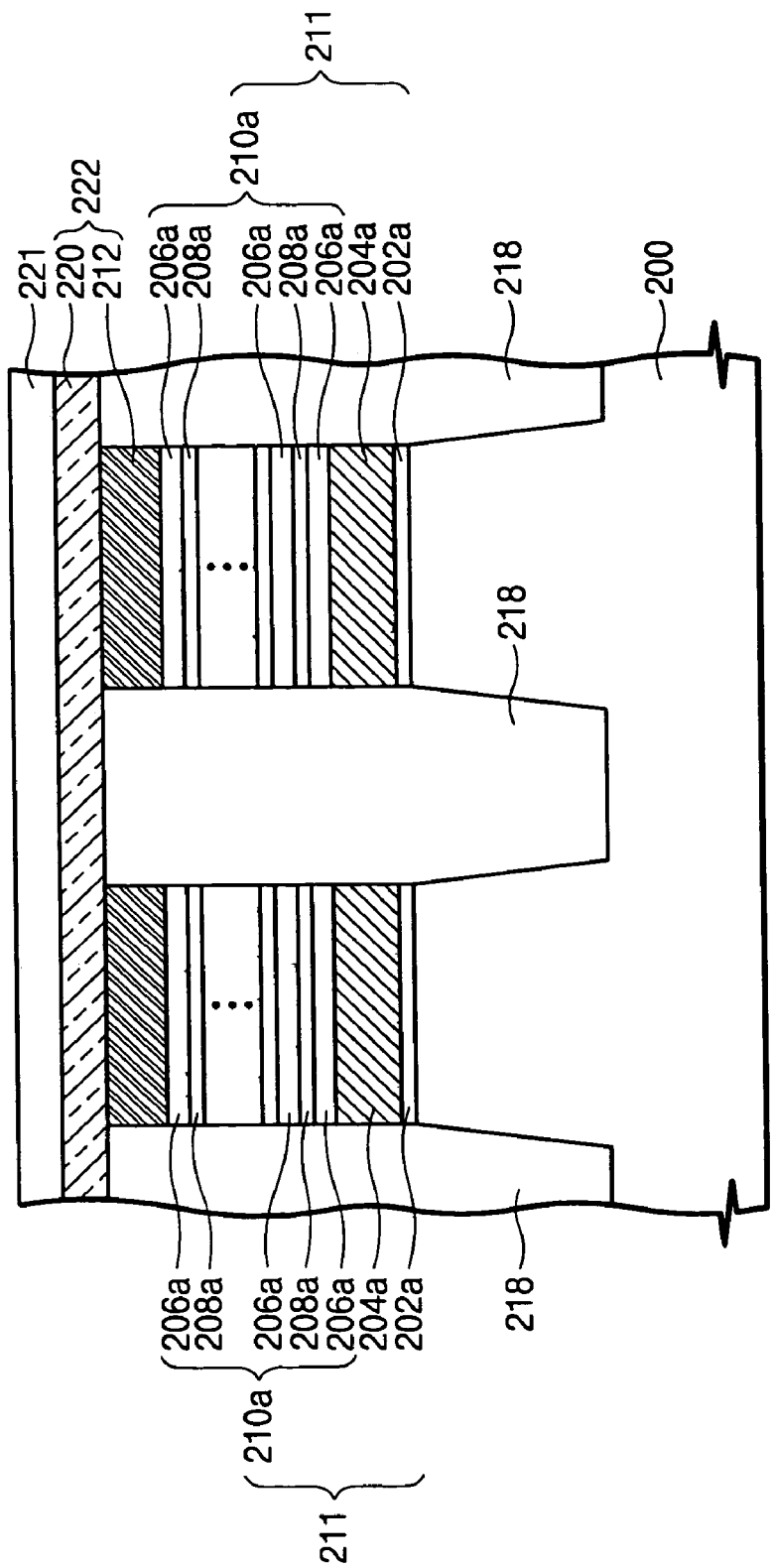
FIG. 11B illustrates a cross-sectional view depicting a semiconductor memory device according to a second preferred embodiment of the present invention, taken along line IV–IV' of FIG. 3.

Referring to FIGS. 11A and 11B, a gate insulating pattern 202a, a storage node 204a, and a multiple tunnel junction pattern 210a are sequentially stacked at a region under the data lines 222 crossing over an isolation pattern, and between isolation patterns 218, to form a plurality of multiple layered patterns 211 by the same method as the first embodiment.

Continuously, a thermal oxidizing process is performed with respect to the resultant structure where the multiple layered patterns 211 are formed, so that a thermal oxide layer 230 may be formed on sidewalls of the data lines 222, the multiple tunnel junction layer 210b, and the storage node 204a. In this process, the multiple tunnel junction layer 210 having a relatively high oxidizing rate is more rapidly oxidized to make a width of the multiple tunnel junction pattern 210a narrower, as shown in FIG. 11A. Then, the thermal oxidizing layer 230 is removed and subsequent processes are performed by the same method as the first embodiment.

Consequently, by decreasing a width of the multiple tunnel junction pattern 210a, but not decreasing a width of the storage node 204a and the data line 222, a leakage current through the multiple tunnel junction pattern 210a may be prevented and an overlapping area of the word lines 228 and the storage nodes 204 may be maximized.

Thus, according to the present invention described above, by decreasing a width of a multiple tunnel junction pattern, but not decreasing a width of a storage node and a data line, a leakage current from a storage node toward a data line may be prevented.

Also, an overlapping area between a word line and a storage node may be maximized. Thus, in a stand-by mode, a data retention characteristic may be improved and a read voltage may be decreased to realize a high-performance semiconductor memory device.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a semiconductor memory device, comprising:
    forming a plurality of trench regions two-dimensionally arranged at a predetermined region of a semiconductor substrate along a row direction and a column direction, to define a mesh-shaped active region, and simultaneously sequentially stacking a gate insulating layer, a storage node layer and a multiple tunnel junction layer on the mesh-shaped active region, the multiple tunnel junction layer including semiconductor layers and tunnel insulating layers that are alternately and repeatedly stacked, and the semiconductor layer formed of a material having a faster etch rate or thermal oxidizing rate than the storage node layer;
    forming a plurality of island-shaped isolation patterns to fill the trench regions;
    forming an interconnection layer on an entire surface of the resultant structure where the isolation patterns are formed;
    continuously patterning the interconnection layer, the multiple tunnel junction layer, the storage node layer and the gate insulating layer to form a plurality of data lines parallel to the column direction and simultaneously sequentially stacking a gate insulating pattern, a storage node pattern and a multiple tunnel junction pattern in regions between the isolation layers under the data lines, wherein a width of the multiple tunnel junction pattern is narrower than widths of the storage node pattern and the data line in a cross-sectional view taken along the row direction;
    forming a conformal gate interlayer dielectric layer on an entire surface of the resultant structure having the storage node pattern; and
    forming a plurality of parallel word lines for crossing over the data lines on the gate interlayer dielectric layer.

2. The method as claimed in claim in 1, wherein the storage node layer is formed of a silicon layer and the semiconductor layer is formed of a silicon germanium layer (SiGe).

3. The method as claimed in claim in 1, further comprising:
    forming an upper conductive layer on the multiple tunnel junction layer to define a mesh-shaped active region; and
    patterning the upper conductive layer when the data line is formed to form an upper conductive pattern on the multiple tunnel junction pattern.

4. The method as claimed in claim 3, wherein the upper conductive layer is formed of a silicon layer.

5. The method as claimed in claim 1, wherein an utmost bottom layer and an utmost top layer of the multiple tunnel junction layer are formed of semiconductor layers.

6. The method as claimed in claim 1, after forming the storage nodes, further comprising: implanting impurities into the active regions between data lines to form a plurality of conductive regions parallel to the data line.

7. The method as claimed in claim 1, after forming the gate insulating pattern, the storage node pattern and the multiple tunnel junction pattern, further comprising:
    forming a thermal oxide layer at sidewalls of the storage node pattern, the multiple tunnel junction pattern and the data line; and
    removing the thermal oxide layer.

8. The method as claimed in claim in 1, after forming the interconnection layer, further comprising: forming a capping insulating layer on the interconnection layer, the capping insulating layer patterned before patterning the interconnection layer to form a capping insulating layer pattern on the data lines.

9. The method as claimed in claim 1, wherein forming of the gate interlayer dielectric layer and the word line comprises:
    forming a gate interlayer dielectric layer and an etch stopping layer at an entire surface of the resultant structure having the storage node patterns;
    forming an interlayer dielectric layer at the entire surface of the resultant structure;
    patterning the interlayer dielectric layer of covering regions between the isolation patterns, along the row direction, to form grooves for exposing the etch stopping layer of covering sidewalls of the storage node pattern, the multiple tunnel junction pattern and the data line;
    removing the exposed etch stopping layer; and
    filling the grooves with a conductive layer to form a word line.

10. The method as claimed in claim 1, wherein forming of the gate interlayer dielectric layer and the word line comprises:
    forming an interlayer dielectric layer at an entire surface of the resultant structure having the storage node patterns;
    patterning the interlayer dielectric layer to form grooves parallel to the row direction for exposing sidewalls of the storage node pattern, the multiple tunnel junction pattern and the data line between the isolation patterns;
    forming a thermal oxidizing layer at sidewalls of the storage node pattern, the multiple tunnel junction pattern and the data line by performing a thermal process with respect to the resultant structure where the grooves are formed; and
    filling the grooves with a conductive layer to form a word line.

* * * * *